(12) United States Patent
Nikitin

(10) Patent No.: US 6,878,935 B2
(45) Date of Patent: Apr. 12, 2005

(54) METHOD OF MEASURING SIZES IN SCAN MICROSCOPES

(75) Inventor: Arkady Nikitin, Ardsley, NY (US)

(73) Assignee: General Phosphorix, Ardsley, NY (US)

( * ) Notice: Subject to any disclaimer, the term of this patent is extended or adjusted under 35 U.S.C. 154(b) by 202 days.

(21) Appl. No.: 10/115,376

(22) Filed: Apr. 3, 2002

(65) Prior Publication Data

US 2004/0021075 A1 Feb. 5, 2004

(51) Int. Cl.[7] .............................................. G01N 23/00
(52) U.S. Cl. ...................................... 250/307; 250/310
(58) Field of Search ................................ 250/307, 310, 250/311, 306; 73/105, 606

(56) References Cited

U.S. PATENT DOCUMENTS 4,766,311 A * 8/1988 Seiler et al. ............. 250/252.1
4,999,496 A * 3/1991 Shaw et al. .................. 250/310
6,184,524 B1 * 2/2001 Brink et al. ................. 250/305
6,563,116 B1 * 5/2003 Nikitin ....................... 250/311

* cited by examiner

Primary Examiner—Nikita Wells
Assistant Examiner—Johnnie L Smith, II
(74) Attorney, Agent, or Firm—J. Zborovsky

(57) ABSTRACT

For measuring sizes in a scanning measuring microscope a nominal magnification is selected so that an object image occupies a substantial part of a field of view, an actual magnification is calculated depending on a coordinate on a screen along the direction of measurement, the object is positioned on a microscope table so that a line of scanning coincides with a direction of measurement and scanned by an electron beam to obtain a function of a video signal, points are localized which correspond to left and right edges of the object on a curve, and a size of the object is determined from the coordinates of the left and right edges and the magnification of the microscope changing from one point to the other.

15 Claims, 12 Drawing Sheets

Flow chart # 2 of the procedures of CD measurement according to invention

Flow chart of traditional strategy of CD measurements.

Block diagram of procedures for size measurement in accordance with Claim 2.

Flow chart # 1 of the procedures of CD measurement according to invention.

Flow chart # 2 of the procedures of CD measurement according to invention

Diagram showing the scanning of a trapezoidal ledge with an electron beam.
-e is electron beam; $X_L$ and $X_R$ are edges of a trapezoidal object in a lower area.

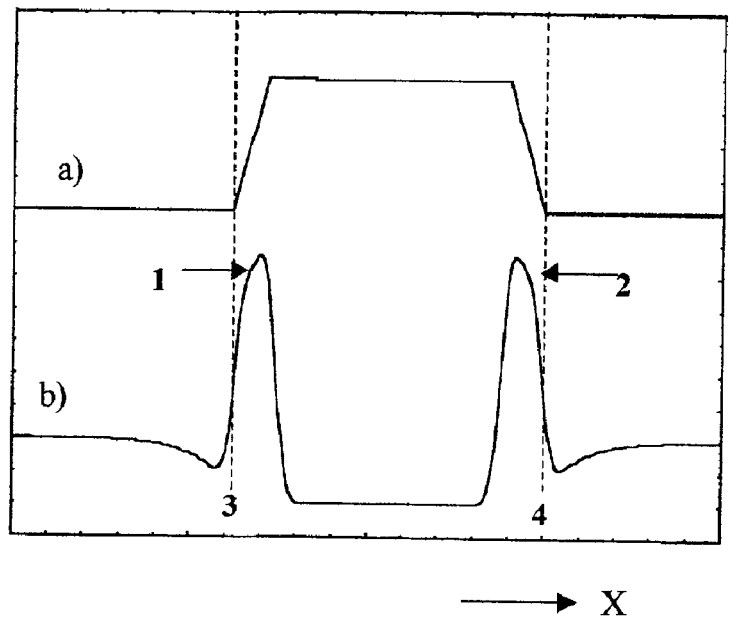

Fig.6

A cross-section of a trapezoidal ledge and a correspondent shape of a video signal S(x).
a) is geometry of a ledge; b) is shape of video signal; 1 is left edge maximum; 2 is a right edge maximum; 3, 4 are coordinate of left ($X_L$) and right ($X_R$) of edges of the measuring object in a lower area.

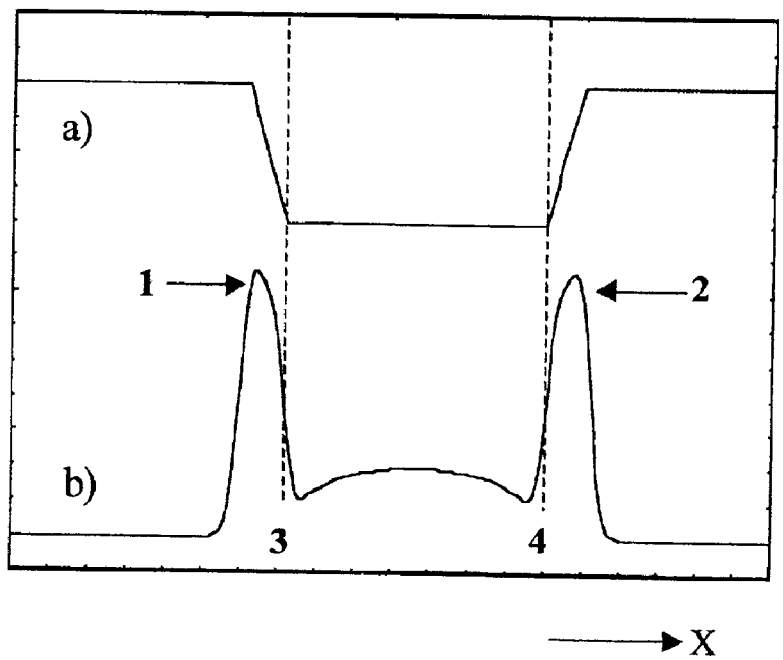

Fig.7

A cross-section of a trapezoidal trench and a correspondent shape of a video signal S(x).
a) is geometry of a trench; b) is shape of video signal; 1 is left edge maximum; 2 is a right edge maximum; 3, 4 are coordinate of left ($X_L$) and right ($X_R$) of edges of the measuring object in a lower area.

Function V(x). Coordinates x along a scanning line in conditional units of pixels is on an abscissa axis, and differences of a magnification of microscope at different points of field of view from magnification in a reference point; a reference point selected in a middle of a scanning line.

Shape of the edge maximum.
1 is the reference point; 2 is the first boundary point;
3 is the second boundary point; 4 – the working area.

Trapezoidal ledge.
a) is a geometry; b) is a video signal; c) is a derivative of a video signal.
L is a size in a lover area.

Trapezoidal trench.
a) is a geometry; b) is a video signal; c) is a derivative of a video signal.
L is a size in a lover area.

Superposition of a video signal and its convolution with an auxiliary Gauss function.
1 is a initial video-signal; 2 is the convolution; D is the intersection point.

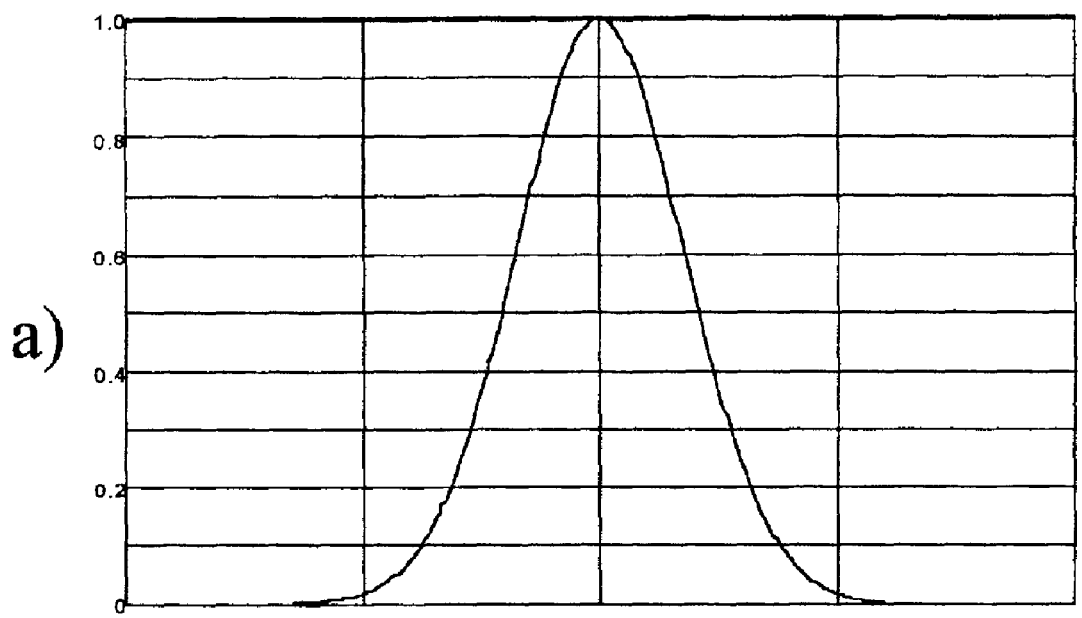
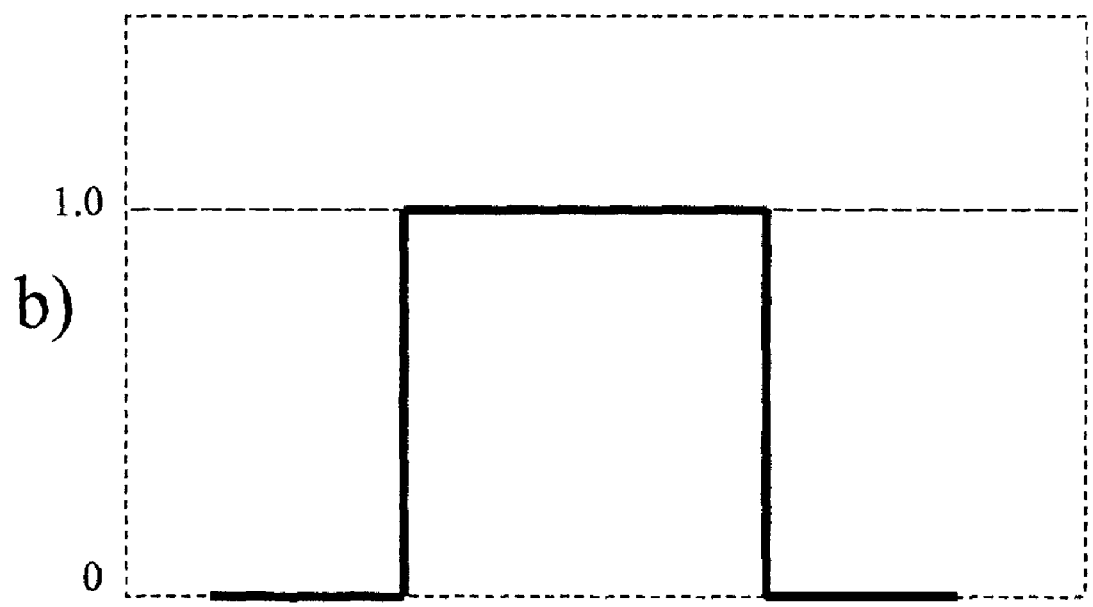
Fig.13.
The auxiliary functions for calculation of a convolution.
a) Gauss function; b) stepped Heaviside function.

METHOD OF MEASURING SIZES IN SCAN MICROSCOPES

BACKGROUND OF THE INVENTION

The present invention relates to a method of measuring sizes in scanning microscopes, in particular for precision measurements of small sizes.

More particularly it relates to precision measurements of small sizes with the use of scanning measuring systems and can be used in high technology processes, in particular in microelectronics for measurement of photo resistive masking features during manufacture of integrated circuit (IC).

Accurate measurements for example of trapezoidal shaped elements with sizes within a submicron and nanometer ranges in scanning electron microscopes have a general scientific and a significant applied importance, since typical objects for such measurements in a micro electronic technology are trapezoidal shaped elements: strips (lines) or rectangles (contact holes) which have a cross-section with a trapezoidal shape and are formed in a layer of photo resist. For many reasons in these cases it is not recommended to use scanning of objects of measurement with a beam of electrons with high energy (more than 5 KeV). Careful scanning with electron beams of low energy (200–1500 eV) leads to specific shapes of video signal, with which it is problematic to determine an accurate value of the size with the use of known algorithms. It is believed that this problem has to be resolved.

Dynamics of developing of microelectronic technology is such that in accordance with the ITRS roadmap in 3–4 years the industry will produce integrated circuits with project rules 100 nm and less. The accuracy of measurements of sizes of the elements of such microcircuits during the process of their manufacturing (interoperational measurements) must be exceptionally high, and an acceptable error corresponds to the value 1.0–1.5 nanometers (3 sigma). At the present time there are no technical solutions which can satisfy these requirements. The problem of the measurements is not to find a method of measurements of such small sizes itself, but to provide a required accuracy of measurements. In view of the economical considerations, the majority of the measurements is performed at the stage of forming of relief photoresist mask resulting from the photolithographic operation. Because of many reasons, side walls of the photoresist elements can not be made exactly vertical. A typical shape of the cross-section is a trapeze. The sizes of elements of integrated circuits formed by etching through a photoresist mask are determined by position of the lower edge of the trapezoidal cross-section of the photoresist mask. Therefore a typical object of measurement is a trapezoidal shaped photoresist element in form of a ledge or a trench with a trapezoidal cross-section. The most important size of such an object is its size in the lower area of the trapeze.

The most widely used process of measurements with scanning electron microscope with a digital scanning system is shown in FIG. 1. It is assumed that the size L of any object to be measured can be calculated as a multiple of two values, namely a size of this object expressed in pixels ($L_P$) and determined in a process of steps related to a left branch in FIG. 1, and a length of pixel (PL) calculated in accordance with the right branch of the same figure:

$$L = L_P \cdot PL$$

As mentioned above, the main problem which is not resolved is to provide accuracy of measurements. There are four main sources of errors in the measurements:

- errors connected with the problem of localization of the edges of the object to be measured on its enlarged scanning electron microscope image or a left branch of the figure;
- errors which are introduced as a result of the operation of calibration of magnification of the microscope related to the right branch;
- errors which are caused by unavoidable noise of the video signal in the scanning electron microscope related to the both branches of the figure;
- errors caused by a strategy of measurements which is shown in FIG. 1 and expressed in the above presented formula.

In order to explain these errors the following has to be explained first. A size of any object is a distance between its edges. In order to determine the size of the object in accordance with its image produced by the scanning electron microscope it is necessary to localize on the image the points which correspond to the edges of the object and to measure a distance between these points with the taking into account the magnification of the microscope. Incorrect or inaccurate procedure of localization of the edges leads inevitably to measurement errors.

Errors of calibration of the magnification (or a pixel length PL calculated during this operation) is incorporated in the value of the size L. Noises of the video signal lead to scattering of both values in the right side of the above mentioned formula, $L_P$ and PL. As a result of the corresponding research it has been determined that due to the incomplete of scan linearity of any real scanning electron microscope, the length of pixel PL in practice is not a constant, but it is changed along the field of view. Therefore, the use of this strategy leads to additional errors which increase with the reduction of the linearity of the scan system of a microscope.

A comparison of the measurements of the same object with different scanning electron microscopes show that differences in values can reach several tens of nanometers, that corresponds to tens of percentages if the object to be measured has the size of about 100 nanometers. This is why the problem of localization of the edge of the element to be measured on its enlarged image is not yet resolved and is considered the major problem in size metrology. The approaches with a threshold crossing and linear approximation which are known in the art includes intuitive assumptions, and therefore such algorithms can provide only evaluating measurements with errors in tens of percentages. This is fully applicable to the problem of localization of the lower edge of a trapezoidal object.

SUMMARY OF THE INVENTION

Accordingly, it is an object of the present invention to provide a method of measuring sizes in scanning microscopes which avoid the disadvantages of the prior art.

The inventive method assumes a preliminary atestation of a scanning system of the measuring microscope and concretely indicates how the information obtained during the atestation can be used for performing the measurements. This provides a high precision measurement with the use of real measuring microscopes which have any, including a significant deviations from the linearity of their scanning systems, and regardless of a level of inhomogenuety of a pitch of a real testing defraction grate which is used in many cases as a reference standard.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 6 is a view showing a cross-section of a trapezoidal ledge and a corresponding shape of a video signal S(x);

FIG. 7 is a view showing a cross-section of a trapezoidal trench and a corresponding shape of a video signal S(x);

FIG. 13 is a view showing two auxiliary functions, which are recommended for use to calculate a convolution namely a Gauss function, and a combination of single Heavyside functions.

DESCRIPTION OF THE PREFERRED EMBODIMENTS

Figure 1:
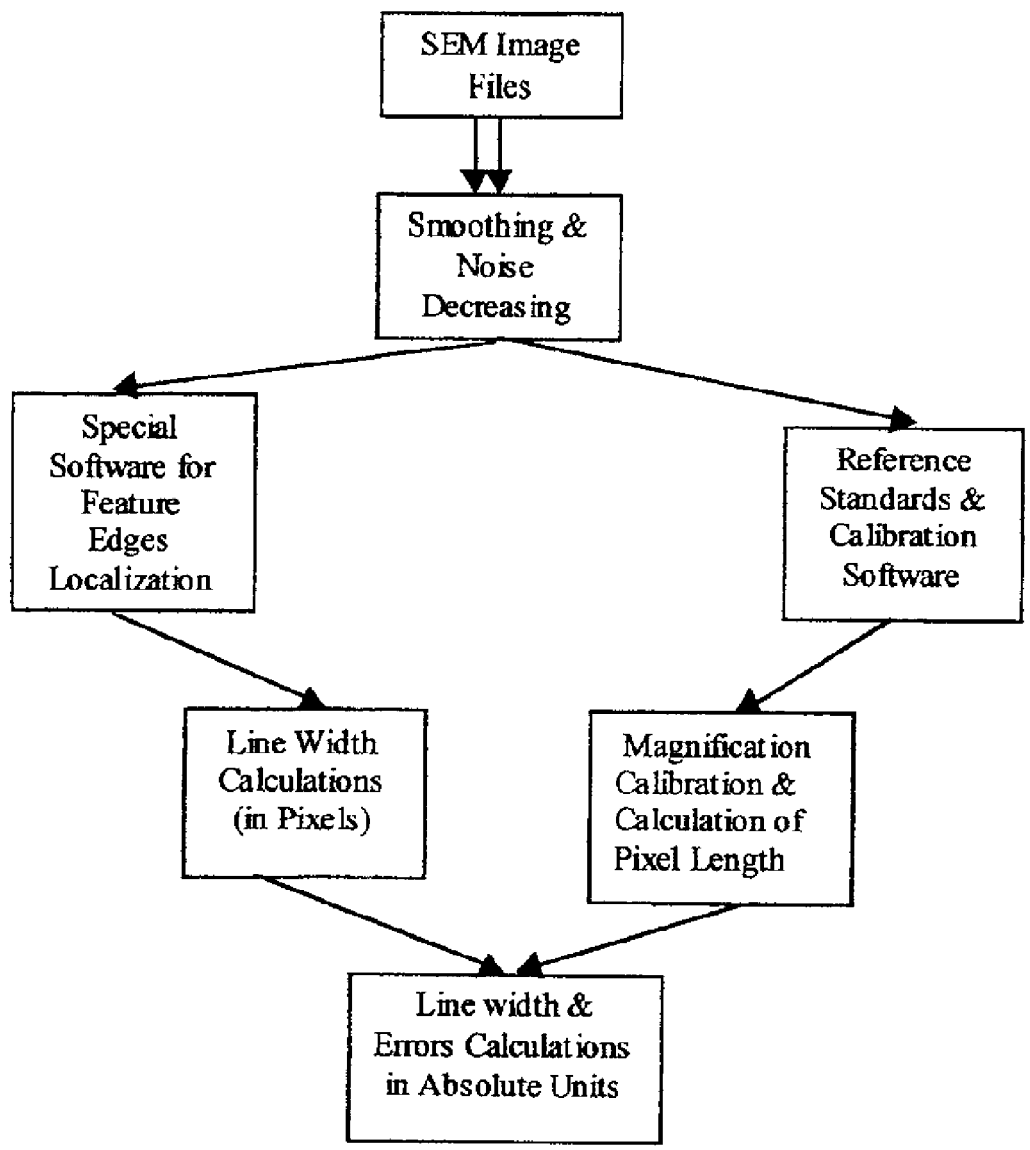
FIG. 1 is a block diagram which illustrates a traditional procedure of measurements of sizes in a scanning electron microscope, wherein scanning systems of the measuring microscope are linear, the length of pixels does not change along a field of view, and therefore at this stage of calculation of sizes in absolute units it is possible simply to multiply a number of pixels measured in a left branch of the figure by a length of the pixel obtained in a right branch of the figure.
Figure 2:
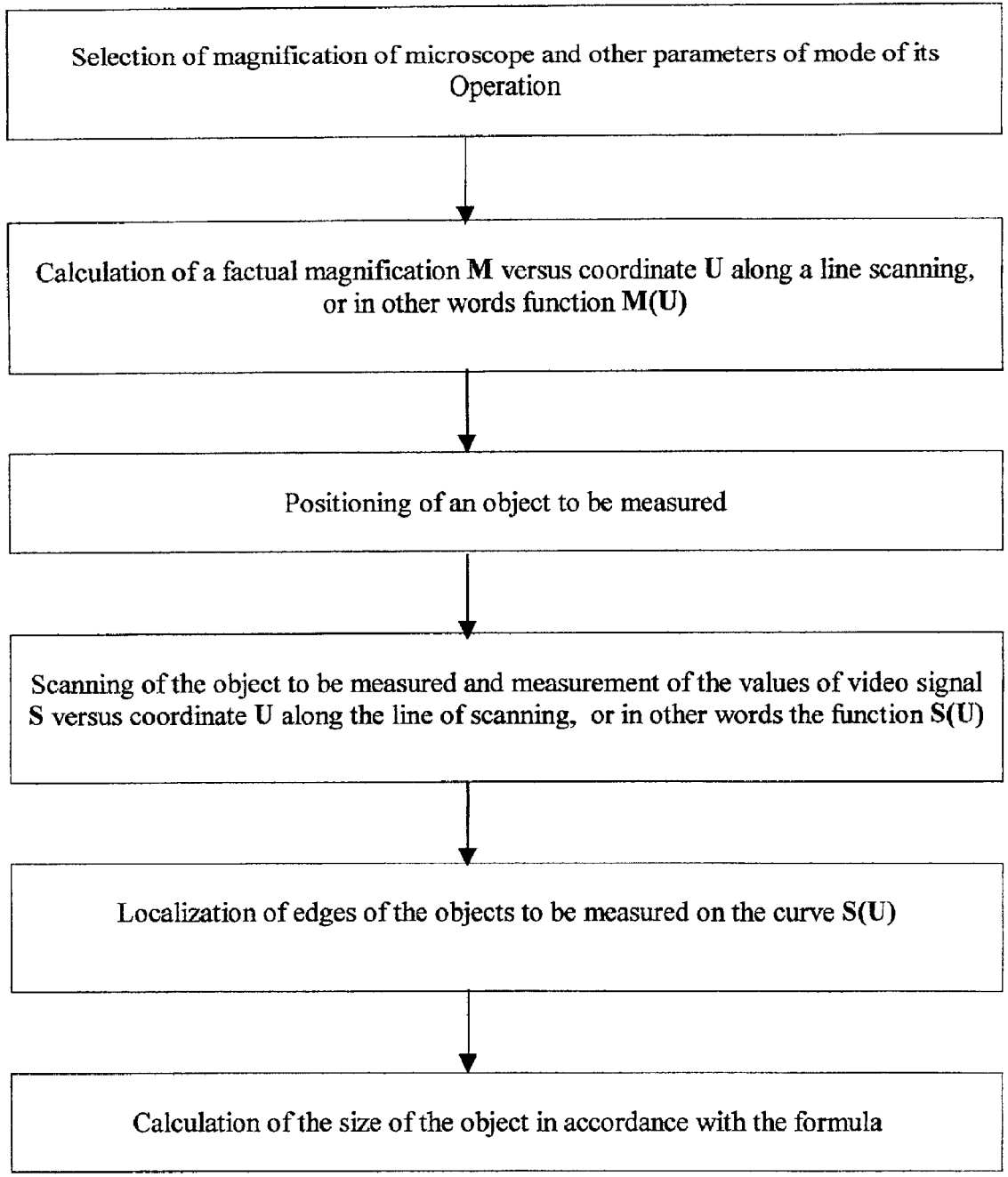
FIG. 2 is a flow chart of a method of size measurement in accordance with claim 2.
Figure 3:
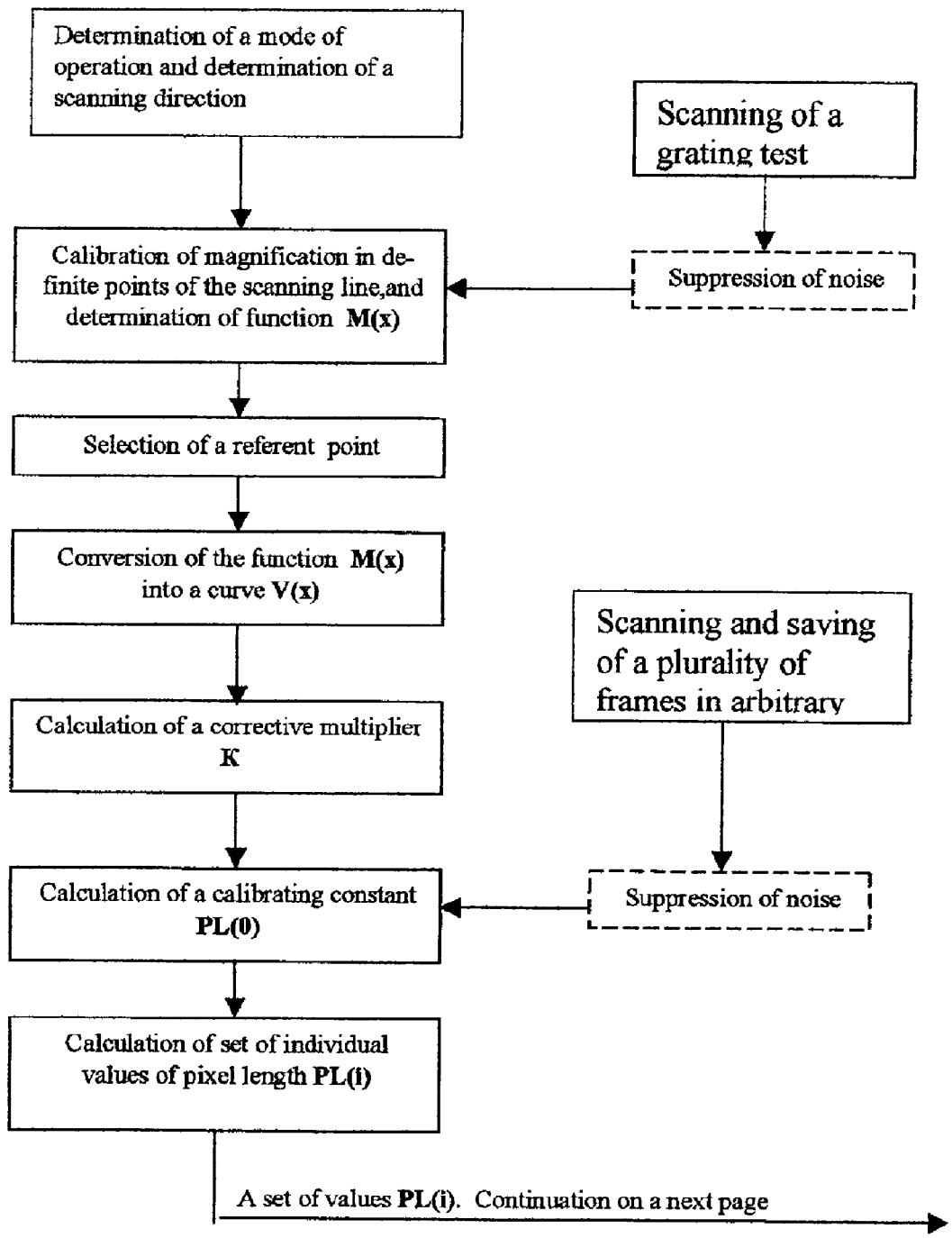
FIGS. 3 and 4 are views illustrating a block diagram of a method of measuring sizes in scanning microscopes in accordance with the present invention, including preparatory of calibrating steps shown in FIG. 3 and the measuring steps shown in FIG. 4.
Figure 4:
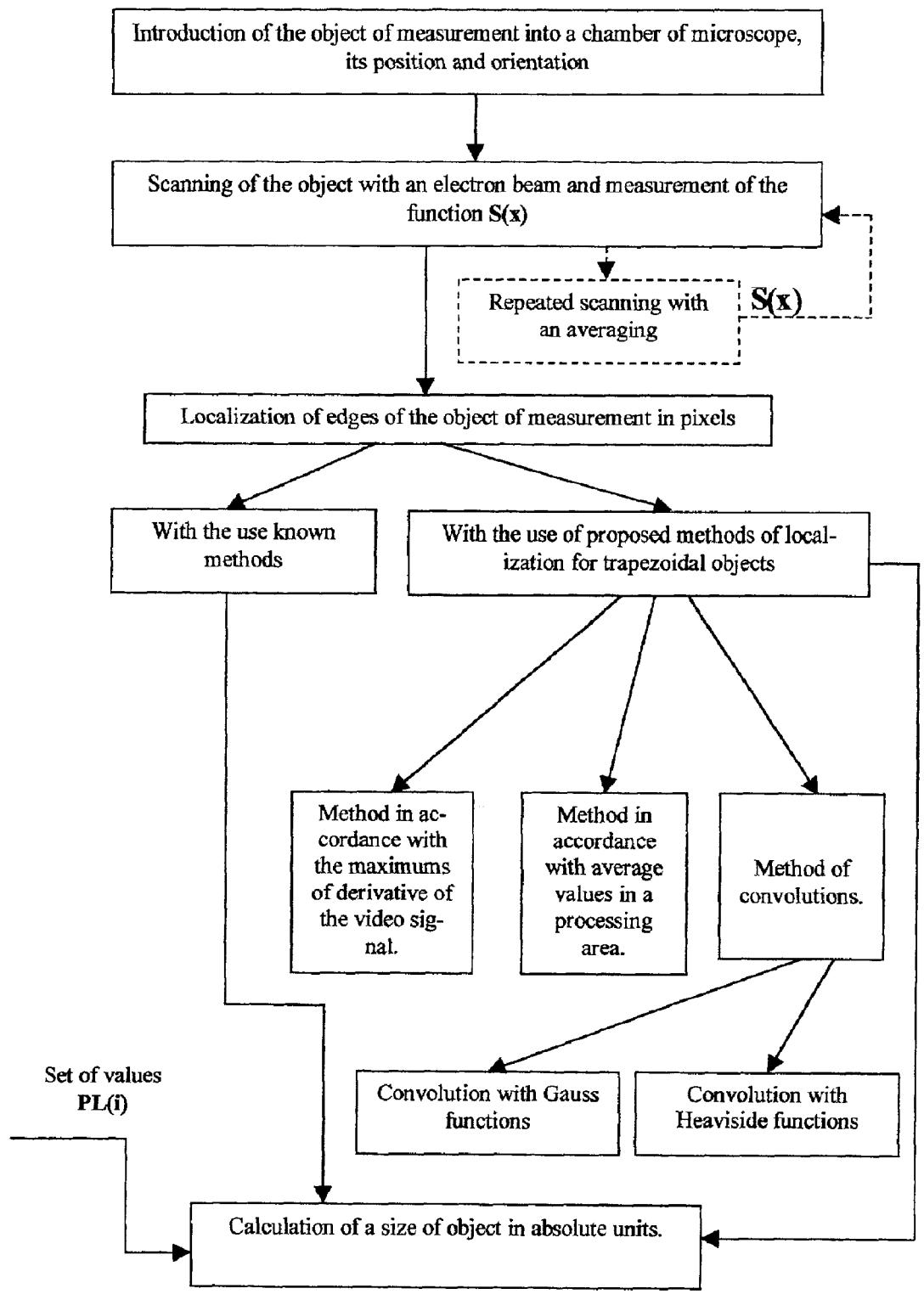
Figure 5:
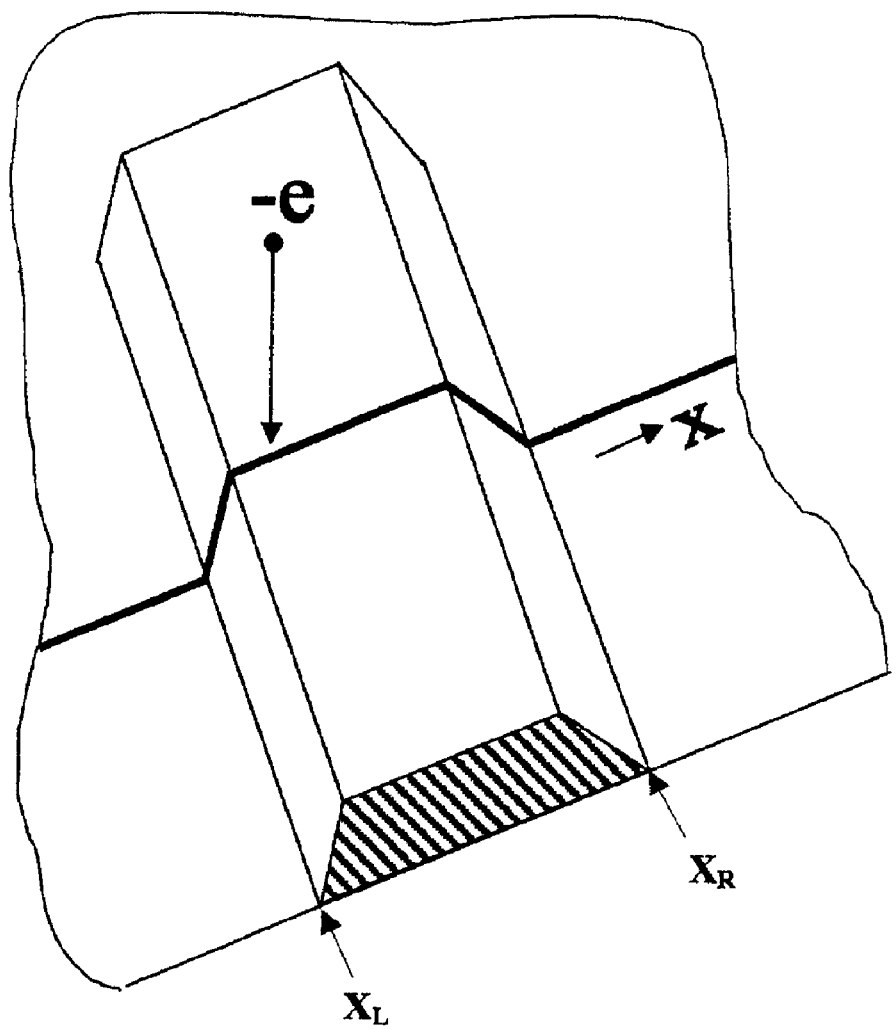
FIG. 5 is a view schematically showing scanning of a trapezoidal ledge with an electronic beam, with a direction of scanning perpendicular to ribs of a trapezoidal shaped ledge.

For measurements in accordance with the present invention, a scanning electron microscope SEM is utilized. The method is suitable also with the use of scanning measuring devices of a different type, for example scanning optical microscopes, scanning tunnel and atomic force devices, etc. Changes which are needed for the corresponding steps of the method with the use of different devices are not substantial and are of a purely technical nature, conditional to the differences in the corresponding devices.

The process of precision measurements of small objects in a SEM in accordance with the present invention includes first of all a determination of a mode of operation of the measuring microscope, which will be used during measurements. In particular, an accelerating voltage, a current of a probe, a value of a working distance, a formal magnification, a speed of development, a type and a mode of operation of a detector, a level of contrast and brightness of an image, a condition of focusing and a level of residual astigmatism are selected. These parameters are determined based on an experience of an operator with consideration of possibilities of the microscope.

The magnification is selected so that it will be convenient to observe the object to be measured on a monitor screen. This condition is satisfied when an image of the object occupies a significant part of a screen, for example from 1/10 to 3/4 of its width.

In an established mode, with the use of one of known methods, for example a method disclosed in our patent application "Method of Determination of True Non Linearity of Scan Along a Selected Direction X or Y in Scanning Microscope" (filing Ser. No. 09/945,527) local values of magnification M are measured in various points U on the screen of the monitor, or in other words a function M(U) is determined. These procedures are of a preparatory nature and performed in an independent experiment before or after scanning of the object to be measured. In the shown example, they are performed before scanning of the object.

In the next step, the object to be measured is introduced into the measuring microscope and positioned on the stage of the microscope so that the direction along which a measurement is to be performed coincides with a line of scanning of the object with an electronic beam.

Focusing of the image of the object to be measured is performed. Then a scanning with an electronic beam and a measurement of dependency of the video signal S from the coordinate U along a line of scanning is measured, or in other words the function S(U).

On the function S(U), with one of the known methods, points which coincide with a left and a right edge of the object to be measured are localized, or in other words the points $U_L$ and $U_R$.

Calculation of a size L of the object to be measured is performed in accordance with the formula $$L = \int_{U_L}^{U_R} \frac{1}{M(U)} dU,$$

wherein $U_L$ and $U_R$ are the above mentioned coordinates of the left and right edges in the image, M(U) is a magnification of the microscope which changes from one point to another point along the direction U and is calculated during the preparatory step.

Herein below a method of measurement is described, which is adapted to the case of the use of a scanning device with digital systems of scanning as a measuring microscope. Here the measuring device is a scanning digital electron microscope.

As before, first a mode of operation of the measuring microscope is determined, which will be used for measurements, in particular its accelerating voltage, the current of a probe, the value of the working distance, the formal magnification, the speed of the scanning, the type and mode of operation of a detector, the level of contrast and brightness of an image, the condition of focusing and the level of residual the astigmatism. These parameters are provided based on an experience of an operator and with consideration of possibilities of the microscope.

The magnification is selected so that it is convenient to observe the object to be measured on a screen of the monitor. This condition is satisfied when the image of the object occupies a significant part of the screen, for example from $\frac{1}{10}$ to $\frac{3}{4}$ of its width.

Then a reference standard is introduced in a field of view of the microscope, formed as a diffraction grating and oriented so that the line of scanning is perpendicular to the direction of the lines of the grating.

Scanning of the reference standard is performed with an electron beam, and a measurement of the distribution of values of the video signal S is performed in dependence on a coordinate x along the line of scanning on the surface of the object to be measured, or in other words the function S(x) for the standard.

The reference standard is displaced in the field of view of the microscope by a controlled distance and the measurement of the function S(x) is repeated for the standard which is displaced from its initial position.

A set of functions S(x) corresponding to different values displacements is utilized for calculation of an average value of a period (pitch) of the diffraction grating in pixels-$\tilde{T}$', and also the magnification of the microscope M in different points x along the line of scanning on the sample, or in other words the function M(x). In order to calculate the function M(x) it is recommended to use two images and an algorithm of their processing which is described in the patent application "Method of Determination of True Non Linearity of Scan Along a Selected Direction X or Y in Scanning Microscope" (filing Ser. No. 09/945,527), related to a step experiment.

The function M(x) is transformed into a standardized function V(x) in accordance with the formula $$V(x) = \left[\frac{M(x)}{M(x_0)}\right] - 1$$

wherein $M(x_0)$ is a magnification in an arbitrarily selected reference point, for example in a middle of the line of scanning.

Figure 8:
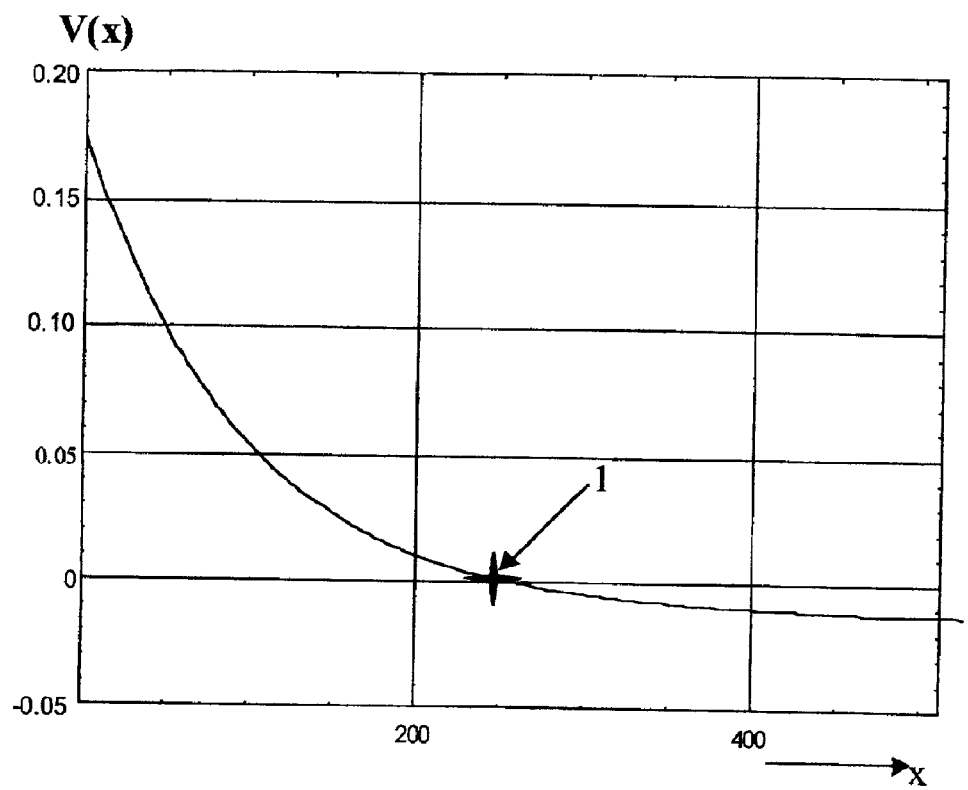
FIG. 8 is a view showing a function V(x) for one of investigated electron microscopes with a reference point selected in a middle of a field of view of the microscope.
Figure 9:
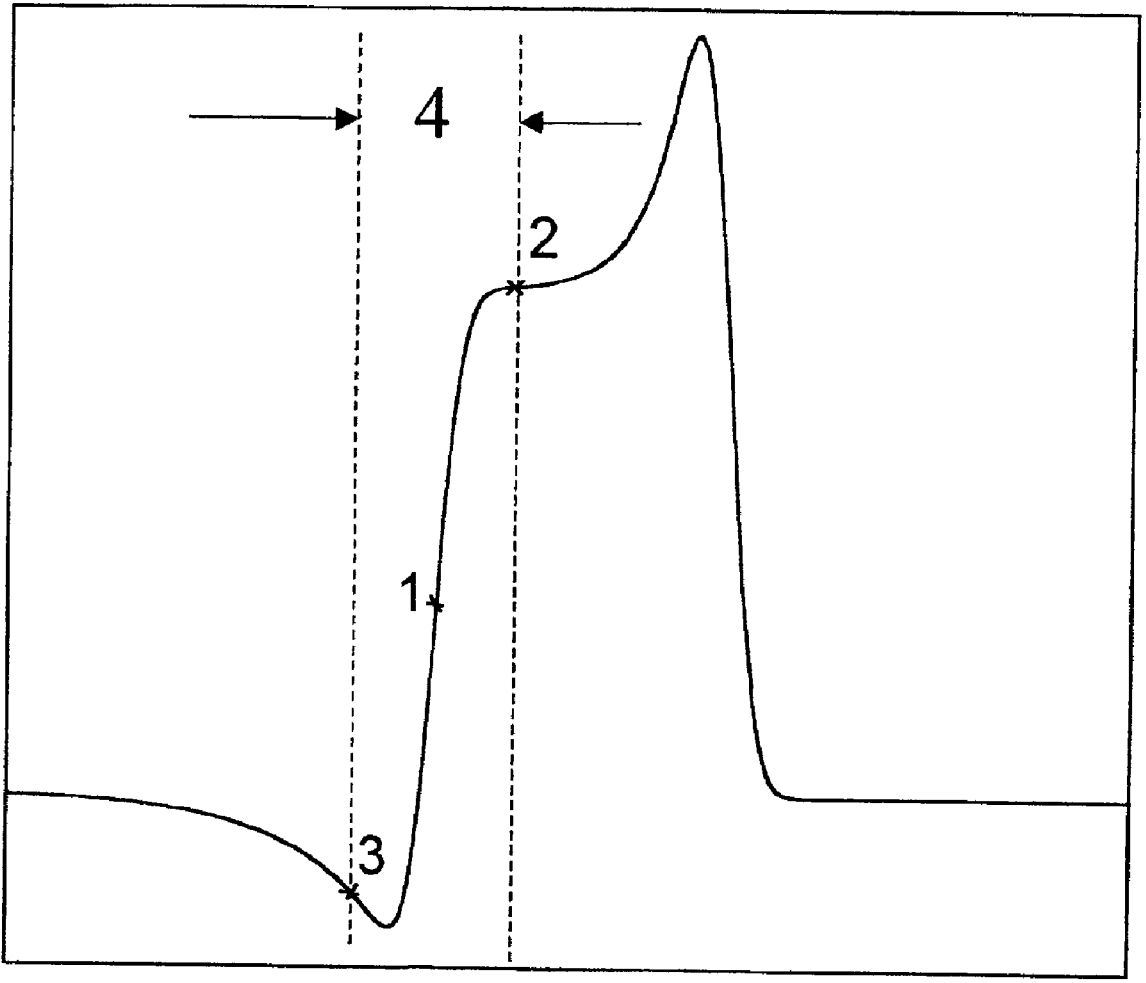
FIG. 9 is a view showing in detail a structure of an edge maximum of the video signal from an object formed as a trench with a trapezoidal cross-section, with positions of points on a slope used for localization of the edge of the trapezoidal objects.
Figure 10:
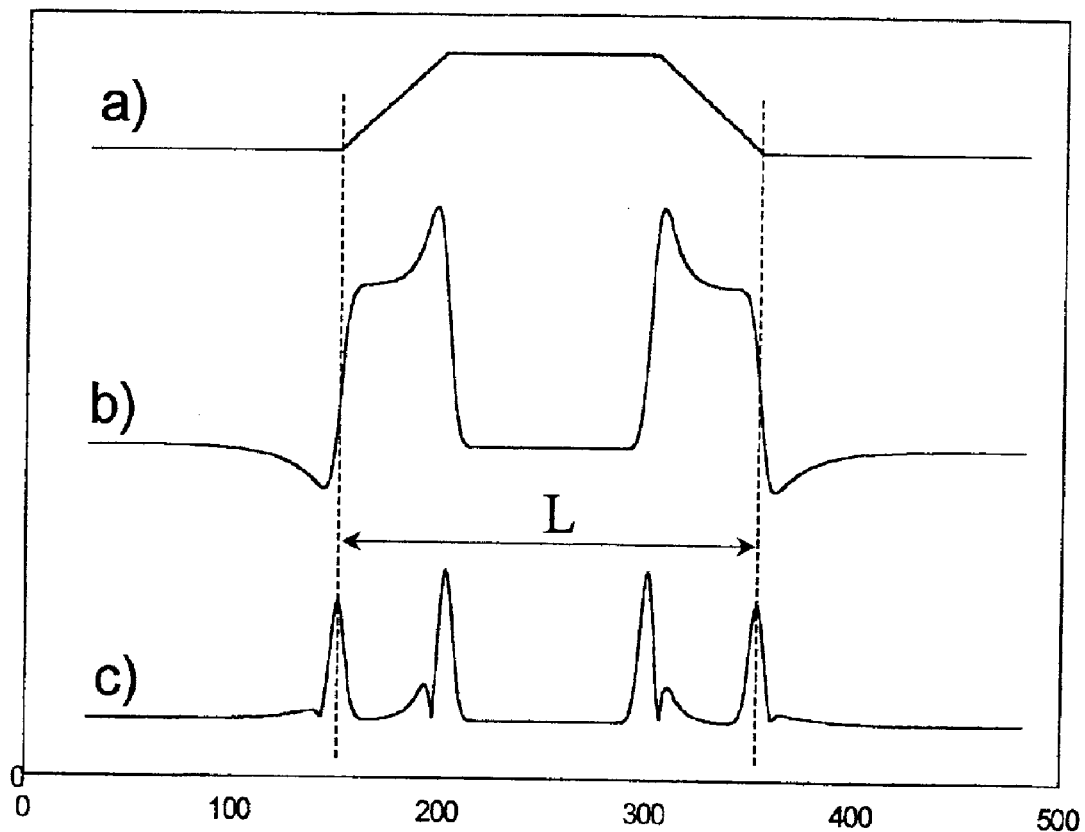
FIG. 10 is a view showing a geometry of a trapezoidal shaped object, and video signal from it, and a module of a derivative of the video signal, wherein maximum of the module of the derivative coincide with lower edges of a base of the trapeze, and the object of the measurement is a ledge.
Figure 11:
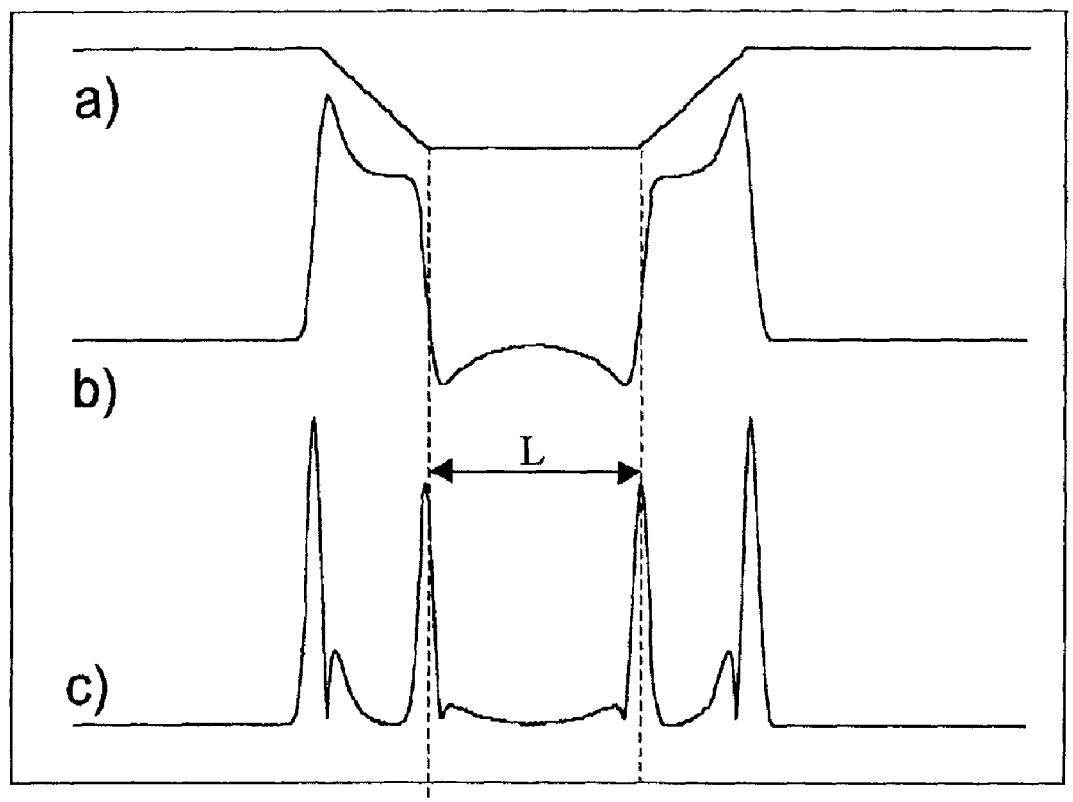
FIG. 11 is a view showing a geometry of a trapezoidal shaped object, and video signal from it, and a module of a derivative of the video signal, wherein maximum of the module of the derivative coincide with lower edges of a base of the trapeze, and the object of the measurement is a trench.
Figure 12:
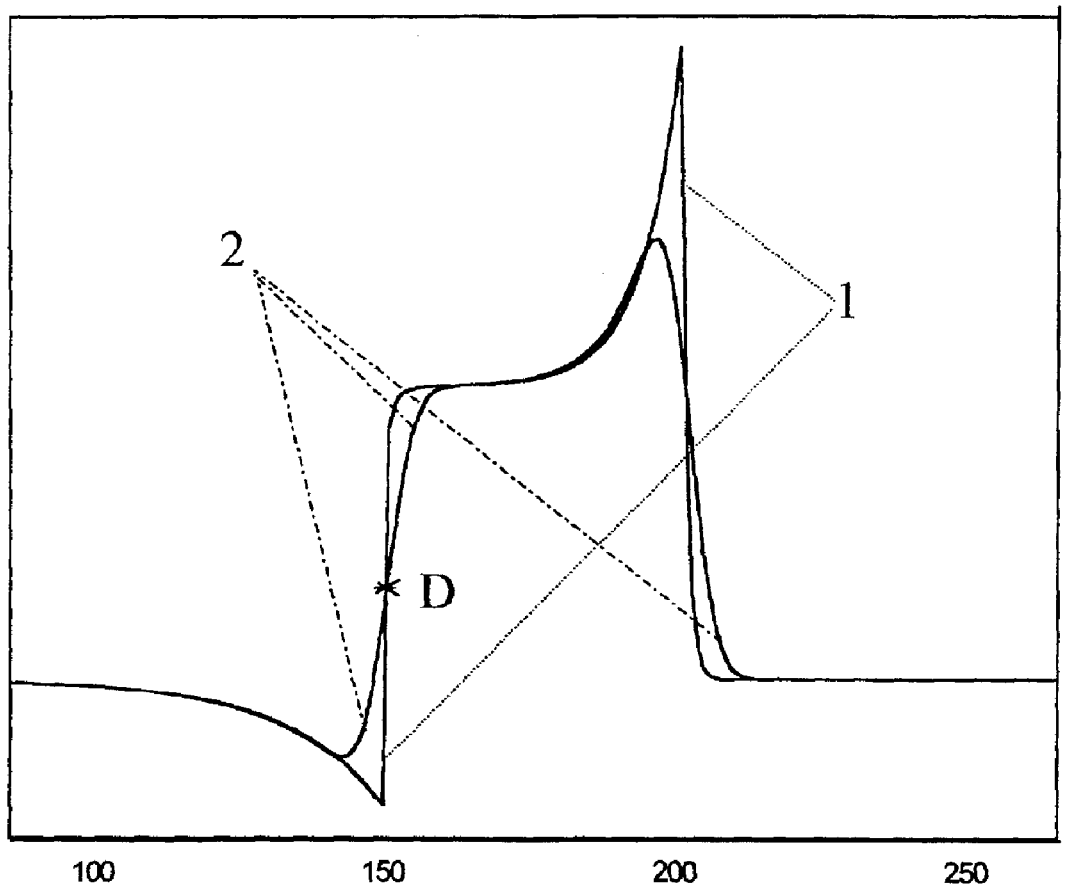
FIG. 12 shows an interposition of the video signal in its convolution with an auxiliary function, with points of their intersection corresponding to borders of a lower base of the trapeze.

The standardized function V(x) is shown in FIG. 8. This function V(x) is utilized for calculation of a correcting multiple K in accordance with the formula $$K = \frac{\int V(x) * dx}{\int dx}.$$

Integration in the numerator and the denominator of this formula is performed along the whole length of the line of scanning. The integral in the denominator has the meaning of a length of the line of scanning.

Then, a calculation of a pixel length PL is performed in the vicinity of the reference point-PL(0) in absolute units in accordance with the formula $$PL(0) = \frac{T * K}{\tilde{T}'},$$

wherein T is a calibrated (passport) average value of the pitch of the used grating standard, expressed in absolute units, and V is an average value of $\tilde{T}$' the period of the grating standard in pixels calculated by averaging over more than 1 field of view of the microscope. A number of the frames for averaging depends on many factors, for example on the value of scatter of individual values of the pitch of the test diffraction grating (the more the scatter the more frames are needed) and on a desired accuracy of calibration, (for obtaining smaller errors of calibration it is necessary to provide more frames). Moreover, this number also depends on the nominal value of a pitch of the test grating and on the magnification of the microscope. For a grating with a pitch of about 350 nanometer, having an average square deviation of individual values of the pitch about 1% and a desired accuracy of calibration at the level of 0.1–0.2% with the magnification of the microscope 50,000, the number of the independent frames for averaging is 70–80.

The last operation of the preliminary process is a calculation of individual values of the pixel length PL for each of n pixels in a line of scanning, or in other words a set of values PL (i) in accordance with the formula $$PL(i) = PL(0) \frac{1}{1 + V(x_i)}.$$

wherein $V(x_i)$ is a value of the standardized function V(x) in the vicinity of a pixel with number i. This completes all preparatory and calibrating procedures.

Procedures of the main process of measurement start from a positioning of the object of measurements on a stage of the microscope so that the line of scanning of the sample with an electron beam coincides with the direction along which the measurements will be performed.

Then focusing of the image of the object is performed. After this, scanning of the object is performed with electron beam, and measurements of values of the video signal S in discrete positions (pixels) is performed depending on the number of the pixel along the line of scanning, or in other words a set of discrete values of the video signal is determined S(1) S(2) S(3) S(4) . . . S(i) . . . S(n).

Then with any known method, localization of the points $x_L$ and $x_R$ is performed which correspond to the left and right edge of the object to be measured on the curve or function S(x), which approximates the above mentioned set of values of the video signal S(i).

The above mentioned operation of scanning can be repeated many times on the same place of the object, or with a displacement of each new line relative to the preceding and formation of a raster. The obtained individual lines can be used for averaging and calculation of one or more averaged lines or in other words average functions Š(x). The subsequent processing of the obtained information is the same in the both cases and it does not depend on whether one function S(x) or the average function Š(x) was processed. Therefore, differences between the function S(x) and the average function Š(x) are ignored.

The next operation of the method is a calculation of the value L of the object to be measured in accordance with the formula $$Ln2 - n1 = \sum_{i=n1}^{n2} PL(i),$$

wherein n1 and n2 are numbers of interpixel intervals within which the points $x_L$ and $x_R$ determined above are located.

The above mentioned step of determination of the length of pixel in the vicinity of the reference point $=PL(0)$ with the use of the preliminarily calculated correcting multiple K and averaged on a few (many) images of the pitch of the grating in pixels-T̃, can be significantly simplified if instead of the diffraction grating, a special test-object is used as a reference standard, which contains at least two concrete points, with a distance $L_C$ between the determined by a calibrating distance of a known length.

In this case a method includes introduction into a field of view of the microscope of the special reference standard, positioning and orientation of the standard so that the line of scanning coincides with the direction of orientation of the calibrating stretch $L_C$, and the selected reference point is located in the middle of this stretch.

The image of the test object is focused in the same way. The scanning of the test object with electronic beam and a measurement of the value of the signal S is performed in dependence on the coordinate x along the line of scanning, or in other words the function S(x) for the reference standard. The length of the calibrating stretch is measured on the video signal S(x) in pixels $L_P$. The length of pixel is calculated in the vicinity of the reference point PL(0) in absolute units in accordance with the formula:

$$PL(0) = \frac{L_c}{L_p}$$

The subsequent actions with the thusly determined constant PL(0) do not distinguish from the actions performed herein above.

It should be mentioned that if the measuring microscope operates in a stable way, it is not necessary to calculate the function V(x) when the mode of operation remains unchanged. To the contrary, the calibrating multiple PL(0) should be calculated in each session of measurements of sizes, even several times per session.

In the inventive method the procedure of localization of the edge of shaped objects with a trapezoidal cross-section is made more concrete. The most important objects of this type are features of a photoresistive mask which is formed on the surface of a semiconductor wafer with photo-, electron- and x-ray lithography. From technological reasons, the side walls of the features of the photoresistive mask can not be made ideally vertical. In the cross-section such features usually have the shape of a trapeze. Such masks serve for providing local etching of the lower working layer of the material, such as oxide, a layer of metal, etc. in the points where windows of the mask are provided with an exposed etched layer. The parts of the wafer which are covered by the layer of photoresist are not accessible for etching, and therefore the working layer in this point is preserved untouched. It is to be understood that the part of the removable working layer boundary is determined by a lower line of a trapezoidal cross-section. This results in a special importance of measurements of shaped objects with a trapezoidal cross-section along a lower line of the trapeze.

With the present invention a special procedure of localization of the edge of shaped trapezoidal objects, such as ledges or trenches, with a trapezoidal shape of a cross-section is proposed, such as for example the features of a photoresistive mask in a microelectronic technology, in accordance with the lower edge of the trapeze. This procedure includes the following steps.

On the video signal S(x) two pronounced maximums which are located at the edges of the object to be measured are found (edge maximums).

Working slopes are selected on each edge maximum, or in other words the slope which adjoin the lower base of the trapezoidal cross-section, in accordance with the rule: for an objects formed as a trapezoidal ledges, these are the outside slope, and for the objects which are formed as trenches with a trapezoidal cross-section they are inner slopes of the edge maximums.

On the working slope of each, left and right edge maximum, reference points are determined as the points where the absolute value of a derivative of the video signal dS(x)/dx has a maximal value, Abscissas of the reference points which are found in this way are the coordinates of the left edge $x_L$ and the right edge $x_R$ of the object to be measured along its lower line.

Modifications of the method of localization of the edge of the trapezoidal shaped objects presented herein above can be include the use of the following actions:

On the working slope of each edge maximum, a first border point which is the closest to the reference point is determined, in which the absolute value of a derivative of the video signal has a minimum, and this border point is located higher on the slope than the reference point.

On the working slope of each edge maximum, a position of a second border point is determined, which is located at the opposite side of the reference point at a distance along an axis of abscissas which is equal to a difference of the abscissas of the reference and the first border point.

A part of the video signal located between the abscissa of the first and the second border point is a region of processing of the video signal on each of its edge maximums.

Within the limits of the area of processing, a maximal (Smax) and a minimal (Smin) value of the video signal is determined, and also a middle point in which the video signal has an average value $S_{AV}=(S_{max}+S_{min})/2$.

The coordinates $x_L$ of the left and $x_R$ of the right edge in trapezoidal objects along the lower line are the abscissas of those points on the left and right edge maximums where the value of the video signal is equal to $S_{AV}$.

Another modification of the method of localization of the edge of trapezoidal shaped objects is the method which includes the following actions.

Within the area of processing of each of the edge maximums, the video signal is converted in its convolution with an auxiliary integratable even function, which is standardized by the integral for this function over endless limits.

The convolution of the two functions, for example of the functions f(z) and g(z-w) is a third function h(w) which is determined by the ratio:

$$h(w) = \int_{-\infty}^{\infty} f(z) \cdot g(z-w) \, dz$$

The video signal S(u) is considered within the area of processing as an initial function f(z). As a second auxiliary function g(z-w) for example a Gauss function is selected $$Y = A\{\exp[-(X^2/\sigma^2)]\},$$

wherein X replaces (z-w), A and σ are constants. In this case the calculation of the convolution is accurate and can be performed easily.

Then the signal and its calculated convolution are superposed over one another, and an abscissa of their point of intersection, or an invariant point, is fixed for each edge maximum of the video signal.

Coordinates $x_L$ of the left and $x_R$ of the right edge of the trapezoidal object along the lower line are the abscissas of the invariant points of the left and right edge maximums.

The selection of the auxiliary function must be made concrete, with the use of the above mentioned Gauss function.

An alternative concretization in the selection of the auxiliary function can be performed with the use of the stepped function which is a multiple of the shifted and oppositely oriented single functions of Heavyside:

$$Y=u(A+t)*u(A-t),$$

wherein u is a single function of Heaviside with an argument t, and A is a constant.

The above mentioned procedure of measurements which is based on a plurality of successive calculations can be easily realized with the use of the computer with special programs, based on the above mentioned steps and the corresponding algorithms used in the inventive method.

It will be understood that each of the elements described above, or two or more together, may also find a useful application in other types of methods and constructions differing from the types described above.

While the invention has been illustrated and described as embodied in method of measuring sizes in scan microscopes, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

What is claimed is:

1. A method of high accuracy measurements of sizes in a scanning measuring microscope, comprising the steps of selecting a nominal magnification of a microscope so that an image of an object to be measured occupies a substantial part of a field of view in a direction of measurements; finding in various points actual magnification of the microscope which changes along the direction of measurement due to incomplete scan linearity; and determining a size of an object with consideration of the actual magnification of the microscope in various points in the direction of measurement due to incomplete scan linearity.

2. A method of high accuracy measurements of sizes in a scanning measuring microscope, comprising the steps or selecting a nominal magnification of a microscope so that an image of an object to be measured occupies a substantial part of field of view in a direction of measurements; finding in various points actual magnification of the microscope which changes along the direction of measurement due to incomplete scan linearity; and determining a size of an object with consideration of the actual magnification of the microscope in various points in the direction of measurement due to incomplete scan linearity, wherein said finding includes calculating an actual magnification of the microscope depending on a coordinate U on a screen of a monitor also along the direction of measurement which corresponds to $M_U$; and further comprising positioning the object to be measured on a table of the microscope so that a line of scanning of the object by an electron beam which coincides with the direction of measurement; scanning of the object to be measured by the electron beam coincides with the direction of measurements; scanning of the object to be measured by the electron beam so as to obtain a function of a video signal S from the coordinate U along a line of scanning S(U); localizing points $U_L U_R$ which correspond to a left and a right edge of the object to be measured on a curve corresponding to S(U); determining a size L of the object to be measured in accordance with the formula $$L = \int_{U_L}^{U_R} \frac{1}{M(U)} dU,$$

wherein $U_L$ and $U_R$ are coordinates of the left and right edges in an image, M(U) is the magnification of the microscope which changes from one point to the other along the direction U.

3. A method of high accuracy measurements of sizes in a scanning measuring microscope, comprising the steps of selecting a nominal magnification of a microscope so that an image of an object to be measured occupies a substantial part of a field of view in a direction of measurements; finding in various points actual magnification of the microscope which changes along the direction of measurement due to incomplete scan linearity; and determining a size of an object with consideration of the actual magnification of the microscope in various points in the direction of measurement due to incomplete scan linearity, wherein said finding includes; introducing into the field of image of the microscope a reference standard formed as a diffraction grate and orienting the same so that a line of scanning is perpendicular to a direction of lines of the grate; scanning the reference standard with an electron beam to determine a distribution of values of a video signal S depending on a coordinate x along the line of scanning which is a function S(x) for the reference standard; processing the function S(x) for determining a magnification of the microscope M in different points X along the line of scanning of the sample which in the function M(x); converting of the function M(x) in a standardized function V(x) in accordance with the formula $$V(x) = \frac{M(x)}{M(X_0)} - 1,$$

wherein $M(x_0)$ is a magnification in arbitrarily selected support point; determining of a correcting multiple X in accordance with the formula $$K = \frac{\int V(x)*dx}{\int dx};$$

integrating a numerator and a denominator of the latter formula along all lengths of the line of scanning; determining of a length a pitch of scanning which has a pixel length near the support point PL(0) in absolute units in accordance with the formula $$PL(0) = \frac{T \cdot K}{T'},$$

wherein T is a calibrating average value of a period of a used grate standard expressed in absolute units, T' is an average value of a period of the grate standard in pixels determined by an averaging over more than one field of vision of the microscope; determining individual values of the length pixel PL for each of n pixels in a line of scanning which is a set of values PL(i) in accordance with the formula $$PL(i) = PL(0) \cdot \frac{1}{1 + V9(x_i)},$$

wherein V(x) is a value of standardized function V(x) near the pixel with number i; positioning of the object of measurement on the table of the microscope so that the line of scanning of the object with electron beam coincides with a correction along which a measurement is to be performed; scanning of the object to be measured with the electron beam to measure values of a video signal S in discrete positions which are pixels, in dependence on a number of pixel i along the scanning line to provide a set of discrete values of video signal S(1), S(2), S(3), S(4) ... S(i) ... S(n): localizing of points $x_L$ and $x_R$ which correspond to a left and a right edge of the object to be measured on a curve S(x) which approximates the set of values of the video signal; determining a size L of the object to be measured in accordance with the formula $$L_{n2-n1} = \sum_{i=n1}^{n2} PL(i),$$

wherein n1 and n2 are numbers of interpixel intervals within which the above found points $x_L$ and $x_R$ are located.

4. A method as defined in claim 2, with the use as the reference standard a test-object which contains at least two concrete points with a distance $L_n$ between the points forming a calibrated section of a known length, wherein said introduction of the reference standard includes positioning and orienting the reference standard so that to line of scanning coincides with an orientation of the calibrating section $L_T$, and the selected support point is located in a middle of said section, end wherein scanning of the reference standard with an electron beam and measurements of the value of the signal S is performed in said dependence said rewards on coordinate x along the line of scanning as a function S(x) for the reference standards; and the determination of a length of a strap includes determining of the video signal S(x) of a length of the calibrating section in pixels $L_P$, and determination at the length of the step of scanning which is the length or pixels PL near the support point PL(O) in absolute units in accordance with the formula $$PL(0) = \frac{L_C}{L_P}.$$

5. A method of high accuracy measurements of size in a scanning measuring microscope, comprising the steps of selecting a nominal magnification of a microscope so that an image of an object to be measured occupies a substantial part of a field of view in a direction of measurements; finding in various points actual magnification of the microscope which changes along the direction of measurement due to incomplete scan linearity; and determining a size of an object with consideration of the actual magnification of the microscope in various points in the direction of measurement due to incomplete scan linearity, wherein for measuring size of shaped objects, including projections and grooves with a trapezoidal shape of a cross-section, to localization of edges of objects to be measured along a lower border of its trapezoidal cross-section; and further comprising determining on the video signal I(x) of two pronounced maxims which are located at an edges of the object to be measured and form edge maximums; on each of the edge maximums working slopes are selected which adjoin the lower base of the trapezoidal section so that for objects formed as trapezoidal projections the slopes are external slopes and for objects which are trapezoidal trenches with a trapezoidal cross-section they are inner slopes of the edge maximums; on the working slope of each left and right edge maximum the reference points are found as points where an absolute value or a derivative of the video signal has a maximum value, and abscesses of the thusly determined reference points being considered as coordinates of the left edge $x_L$ and the right edge $x_R$ of the edge of the object to be measured along its lower area.

6. A method as defined in claim 2, wherein for measuring sizes of shaped objects, including projections and grooves with a trapezoidal shape of a cross-section, for localization or edges of objects to be measured along a lower border of its trapezoidal cross-section; and further which are located at an edges of the object to be measured and form edge maximums; on each of the edge maximums working slopes are selected which adjoin the lower base of the trapezoidal section so that for objects formed as trapezoidal projections the slopes are external slopes and for objects which are trapezoidal trenches with a trapezoidal cross-section they are inner slopes of the edge maximums; on the working slope of each left and right edge maximum the reference points are found as points where an absolute value of a derivative of the video signal has maximum value, and abscesses of the thusly determined edge maximum a first border point which is closes to the reference point and in which an absolute value of a derivative of the video signal has a minimum and its border point is located above on the slope in the reference point, on the working slope of each edge maximum finding a position of the second border point located at an opposite side of the reference point a distance along an axis of abscissa which equal to a difference of abscissas of the reference point in the first border point; considering a section of the video signal between the abscissas of the first end second border points as an area of processing of the video signal on each of its edge maximum; finding within the range of processing maximal (Smax) and minimal (Smin) values of the video signal and also a medium point where the video signal has an average value $S_{AV}=$ (SmaxSmin)/2, and considering the coordinates $x_L$ or the left and $x_R$ of the right edge of the trapezoidal object along a lower area from abscissas of the points at the left and the right edge maximum where the value of the video signal is equal to $S_{av}$.

7. A method as defined in claim 4, wherein the consideration of the coordinates includes finding on the working slope of each edge maximum a first border point which is closes to the reference point and in which an absolute value of a derivative of the video signal has a minimum and its border point is located above on the slope in the reference point, on the working slops of each edge maximum finding a position of the second border point located at an opposite side of the reference point a distance along an axis of abscise which is equal to a difference of abscises of the reference point in the first border point; considering a section of the video signal between the abscesses of the first and second border points as an area of processing of the video signal on each of its edge maximum; finding within the range of processing maximal (Smax) and minimal (Smin) values of the video signal and also a medium point where the video signal has an average value $S_{AV}=(SmaxSmin)/2$, and considering the coordinates $x_L$ of the left and $x_R$ of the right edge of the trapezoidal object along a lower area from abecises of the points at the left and the right edge maximum where the value of the video signal is equal to $S_{av}$.

8. A method as defined in claim 4, wherein the consideration of the coordinates includes finding on the working slope of each point located at an opposite side of the reference point a distance along an axis of abscise which is equal to a difference of abscises of the reference point in the first border point; considering a section of the video signal between the abscises of the first and second border points as an area of processing of the video signal on each of its edge maximum; finding within the range of processing maximal (Smax) and minimal (Smin) values of the video signal and also a medium point where the video signal has an average value $S_{AV}=(SmaxSmin)/2$, and considering the coordinates $x_L$ of the left and $x_R$ of the right edge of the trapezoidal object along a lower area from abscises of the points at the left and the right edge maximum where the value of the video signal is equal to $S_{av}$.

9. A method as defined in claim 5, wherein the consideration of the coordinates includes finding on the working slope of each edge maximum a first border point which is closes to the reference point and in which an absolute value of a derivative of the video signal has a minimum and its border point is located above on the slope in the reference point, on the working slope of each edge maximum finding a position of the second border reference points being considered as coordinates of the left edge $x_L$ and the right edge $x_R$ of the edge of the object to be measured along its lower area.

10. A method as defined in claim 6, wherein determining within the range of processing of the maximum and minimum values of the video signal and the average point includes converting the video signal within the region of processing of each of the edge maximums into a convolution with auxiliary integrating even function standardized by integral of this function in accordance with endless limits; and considering the coordinates of the left and right edges of the trapezoidal object by superposing of the initial video signal and its convolution over one another with fixation of an abscise of a point of their intersection which is an invariant point for edge maximum of the video signal, and considering the coordinates $x_L$ of the left $x_R$ of the right edges of the trapezoidal object along a lower area by an abscissa of the variant points at the left and right edge maximums.

11. A method as defined in claim 7, wherein determining within the range of processing of the maximum and minimum values of the video signal and the average point includes converting the video signal within the region of processing of each of the edge maximums into a convolution with auxiliary integrating even function standardized by integral of this function in accordance with endless limits; and considering the coordinates of the left and right edges of the trapezoidal object by superposing of the initial video signal and its convolution over one another with fixation of an abscissa of a point of their intersection which is an invariant point for edge maximum of the video signal, and considering the coordinates $x_L$ of the left $x_L$ of the right edges of the trapezoidal object along a lower area by an abscissa of the variant points at the left and right edge maximums.

12. A method as defined in claim 8, wherein the interposition of the video signal in its convolution includes use as the auxiliary function $$Y=A\{\exp[-X^2/\sigma^2)]\},$$

wherein A and $\sigma$ are constants.

13. A method as defined in claim 9, wherein the interposition of the video signal in its convolution includes use as the auxiliary function $$Y=A\{\exp[-X^2/\sigma^2)]\},$$

wherein A and $\sigma$ are constants.

14. A method as defined in claim 8; and further comprising as the auxiliary function a step function which is a multiple of shifted and oppositely oriented single functions of Heaviside $$Y=n(A+t)*u(A-t),$$

wherein u is a single function of Heaviside with an argument t, A is a constant.

15. A method as defined in claim 9; and further comprising as the auxiliary function a step function which is a multiple of shifted and oppositely oriented single functions of Heaviside $$Y=n(A+t)*u(A-t),$$

wherein u is a single function of Heaviside with an argument t, A is a constant.

* * * * *